United States Patent [19]

Fukaishi

[11] Patent Number: 5,698,888
[45] Date of Patent: Dec. 16, 1997

[54] COMPOUND SEMICONDUCTOR FIELD EFFECT TRANSISTOR FREE FROM PIEZOELECTRIC EFFECTS REGARDLESS OF ORIENTATION OF GATE ELECTRODE

[75] Inventor: Muneo Fukaishi, Tokyo, Japan

[73] Assignee: NEC Corporation, Japan

[21] Appl. No.: 637,037

[22] Filed: Apr. 24, 1996

[30] Foreign Application Priority Data

Apr. 24, 1995 [JP] Japan ................. 7-098335

[51] Int. Cl.$^6$ ................. H01L 29/82
[52] U.S. Cl. ................. 257/420; 257/66; 257/76; 257/192; 257/245; 257/249; 257/254; 257/284; 257/472; 257/773
[58] Field of Search ................. 257/66, 76, 192, 257/245, 249, 254, 284, 420, 472, 773

[56] References Cited

FOREIGN PATENT DOCUMENTS

| 61-88567 | 5/1986 | Japan | ............ H01L 28/80 |
| 2-257618 | 10/1990 | Japan | ............ H01L 21/285 |
| 6-151472 | 5/1994 | Japan | ............ H01L 21/338 |

OTHER PUBLICATIONS

"Piexoelectric Effects i GaAs FET's and Their Role in Orientation–Dependent Device Characteristics" Asbeck et al IEEE Transactions on Electron Devices, vol. ED–31, No. 10, Oct. 1984; pp. 1377–1380.

"Theoretical Study of th Piezoelectric Effect on GaAs MESFET's on (100), (011), and (111) Ga, and (111) As Substrates" Onodera et al; IEEE Transactions on Electron Devices, vol. 36, No. 9; Sep. 1989; pp. 1580–1584.

"Experimental Sudy of the Orientation Effect of GaAs MESFET's Fabricated on (100), (011), and (111) Ga, and (111) As Substrates" Onodera et al; IEEE Transactions On Electron Devices, vol. 36; No. 9; Sep. 1989; pp. 1586–1590.

Primary Examiner—Edward Wojciechowicz
Attorney, Agent, or Firm—Hayes, Soloway, Hennessey, Grossman & Hage, P.C.

[57] ABSTRACT

A metal-semiconductor type field effect transistor has a Y-letter shaped gate electrode standing on an active layer, and the Y-letter shaped gate electrode prevents piezoelectric charges induced beneath both ends of the wing portions thereof from undesirable merger so as to restrict variation of the threshold regardless of the orientation of the Y-letter shaped gate electrode.

7 Claims, 7 Drawing Sheets

COMPOUND SEMICONDUCTOR FIELD EFFECT TRANSISTOR FREE FROM PIEZOELECTRIC EFFECTS REGARDLESS OF ORIENTATION OF GATE ELECTRODE

FIELD OF THE INVENTION

This invention relates to a compound semiconductor field effect transistor and, more particularly, to a compound semiconductor field effect transistor free from piezoelectric effects due to stress of a dielectric over layer regardless of the gate electrode orientation.

DESCRIPTION OF THE RELATED ART

Research and development efforts are being made for faster and low-power consumption transistor with an emphasis put on a miniaturization technology for III–V compound semiconductors such as gallium-arsenide. However, as reported by Peter M. Asbeck et. al. in "Piezoelectric Effects in GaAs FET's and Their Role in Orientation-Dependent Device Characteristics", IEEE Transactions on Electron Devices, vol. ED-31, No. 10, October 1984, pages 1377 to 1380, when field effect transistors are fabricated on a gallium arsenide wafer, an inter-level/passivation layer gives rise to piezoelectric effects in the gallium arsenide wafer due to the elastic stress, and induces piezoelectric charge. The piezoelectric charge is introduced in the channel regions of the field effect transistors, and undesirably varies the threshold voltages of the transistors.

The amount of piezoelectric charge is in dependent on the thickness of the inter-level/passivation layer, and the unavoidable lack of uniformity of the inter-level/passivation layer results in uneven distribution of the piezoelectric charge on the gallium arsenide wafer. This means that the inequality takes place between the field effect transistors fabricated on the gallium arsenide wafer.

Other factors of the inequalable piezoelectric charge are the orientation of the major surface of the gallium arsenide wafer and the direction of the drain current, and the distribution and the charge density are variable in dependent on these factors. The inequalable piezoelectric charge strongly affects smaller-sized field effect transistors. For this reason, there is an increasing interest in a restriction of the inequality of the piezoelectric charge.

Japanese Patent Publication of Unexamined Application No. 6-151472 discloses results of a research work on the influence of the piezoelectric charge. The Japanese Patent Publication of Unexamined Application teaches that the deterioration of the field effect transistor is not serious in so far as the stress of the dielectric over layer is restricted, and the acceptable stress range is expressed as $\|S\| \leq 100/\mathrm{SQRT}(L)$ where $\|S\|$ is the absolute value of the stress, L is the gate length of the field effect transistor and SQRT is representative of the square root. The stress is varied by changing the thickness of the dielectric over layer, and the Japanese Patent Publication of Unexamined Application only suggests using a thin dielectric over layer.

Japanese Patent Publication of Unexamined Application No. 2-257618 discloses a stress reduction technology. The stress reduction technology disclosed therein is to make the stress of gate electrode cancel out the stress of the dielectric over layer. According to the Japanese Patent Publication of Unexamined Application, if the argon gas pressure is changed during the sputtering on tungsten silicide target, the stress in the deposited tungsten silicide layer is also varied between the compressive stress and the tensile stress. Therefore, when the gate electrode is formed from the tungsten silicide layer deposited through the sputtering in an appropriately regulated gas pressure, the gate electrode generates a compressive stress or a tensile stress which cancels the stress of the dielectric over layer. The residual stress induces only a small amount of piezoelectric charge, and the small amount of piezoelectric charge makes the variation of threshold ignoreable.

Japanese Patent Publication of Unexamined Application No. 61-88567 discloses another approach. The Japanese Patent Publication of Unexamined Application teaches that the piezoelectric charge is variable in dependent on the crystal orientation, and recommends a direction of drain current in parallel to [1 N* 0] direction for a field effect transistor fabricated on (N 1 0) lattice plane of a gallium-arsenide wafer. The asterisk (*) means an overline, and N* is representative of N.

The first prior art merely teaches the acceptable stress range, and no particular stress reduction technology is taught in the Japanese Patent Publication of Unexamined Application. On the other hand, the second prior art teaches a particular stress reduction technology. Although the stress of the gate electrode theoretically cancels the stress of the dielectric over layer, perfect cancellation is quite rare in an actual fabrication process. The remaining stress induces the piezoelectric charge, and seriously affects the threshold voltage of a miniaturized field effect transistor.

When the gate electrodes of field effect transistors are oriented as disclosed in the third prior art, the threshold voltage of the field effect transistor approximate target value. However, the gallium arsenide crystal is hardly cleavaged along the proposed direction of the drain current. For this reason, the third prior art technology requires a complicated layout for the field effect transistors, and such a complicated layout is a technical barrier against large integration.

SUMMARY OF THE INVENTION

It is therefore an important object of the present invention to provide a field effect transistor which is fabricated on a semiconductor wafer at high integration density under well controlled piezoelectric effects.

The present inventor had studied the serious influence of a short rectangular gate electrode, and noticed that the piezoelectric charge induced beneath one end of the short rectangular gate electrode was merged with the piezoelectric charge induced beneath the other end of the short rectangular gate electrode. The present inventor looked for a gate configuration which created a short channel but did not allow the piezoelectric charges induced beneath both ends thereof to merge into one another.

To accomplish the object, the present invention proposes to split a dielectric over layer over an active layer into an upper portion and a lower portion for decreasing a stress exerted on the active layer. Only the lower portion exerts the stress on the active layer, and a wing portion effectively splits the dielectric over layer.

In accordance with the present invention, there is provided a field effect transistor comprising: an active layer formed of a semiconductor material having a piezoelectric crystal structure, and providing a conductive channel in a first area of the active layer for electrically connecting a second area of the active layer on one side of the first area to a third area of the active layer on the other side of the first area; first and second electrodes held in contact with the second area and the third area, respectively; an dielectric over layer formed on the first to third areas; and a gate electrode formed in the dielectric over layer and having a stem portion provided over the first area for generating the conductive channel and a gate portion spread from the stem portion in such a manner as to extend in the dielectric over layer over the active layer without forming a conductive channel, thereby decreasing a stress exerted on the second and third areas due to the insulating layer.

BRIEF DESCRIPTION OF THE DRAWINGS

The features and advantages of the field effect transistor according to the present invention will be more clearly understood from the following description taken in conjunction with the accompanying drawings in which.

DESCRIPTION OF THE PREFERRED EMBODIMENT

Figure 1:
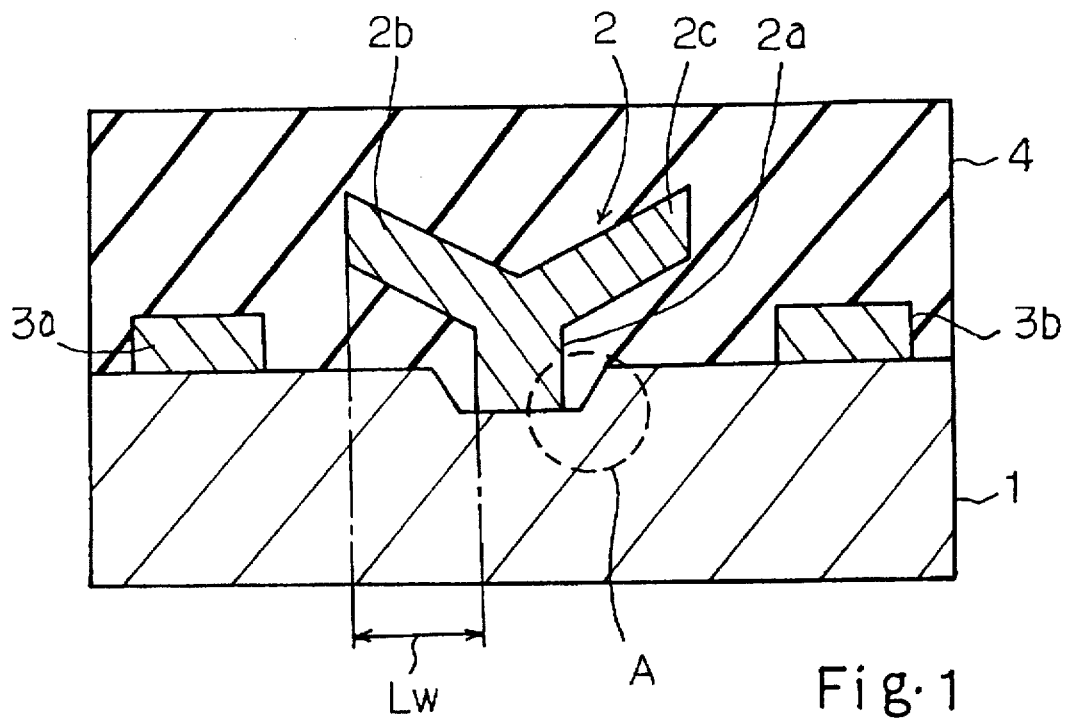
FIG. 1 is cross sectional view showing the structure of a field effect transistor according to the present invention.
Figure 2:
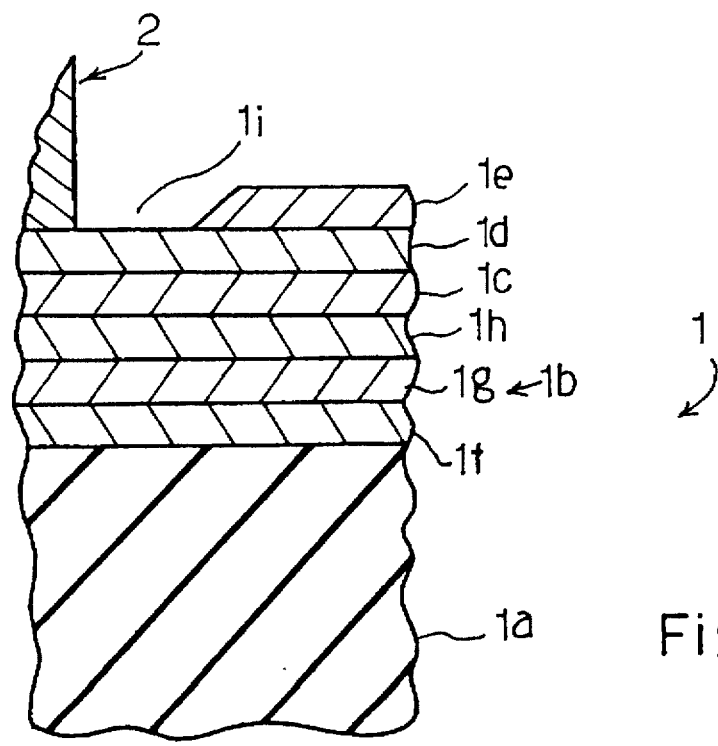
FIG. 2 is a cross sectional view showing a part of the structure enclosed in circle A of FIG. 1.
Figure 3:
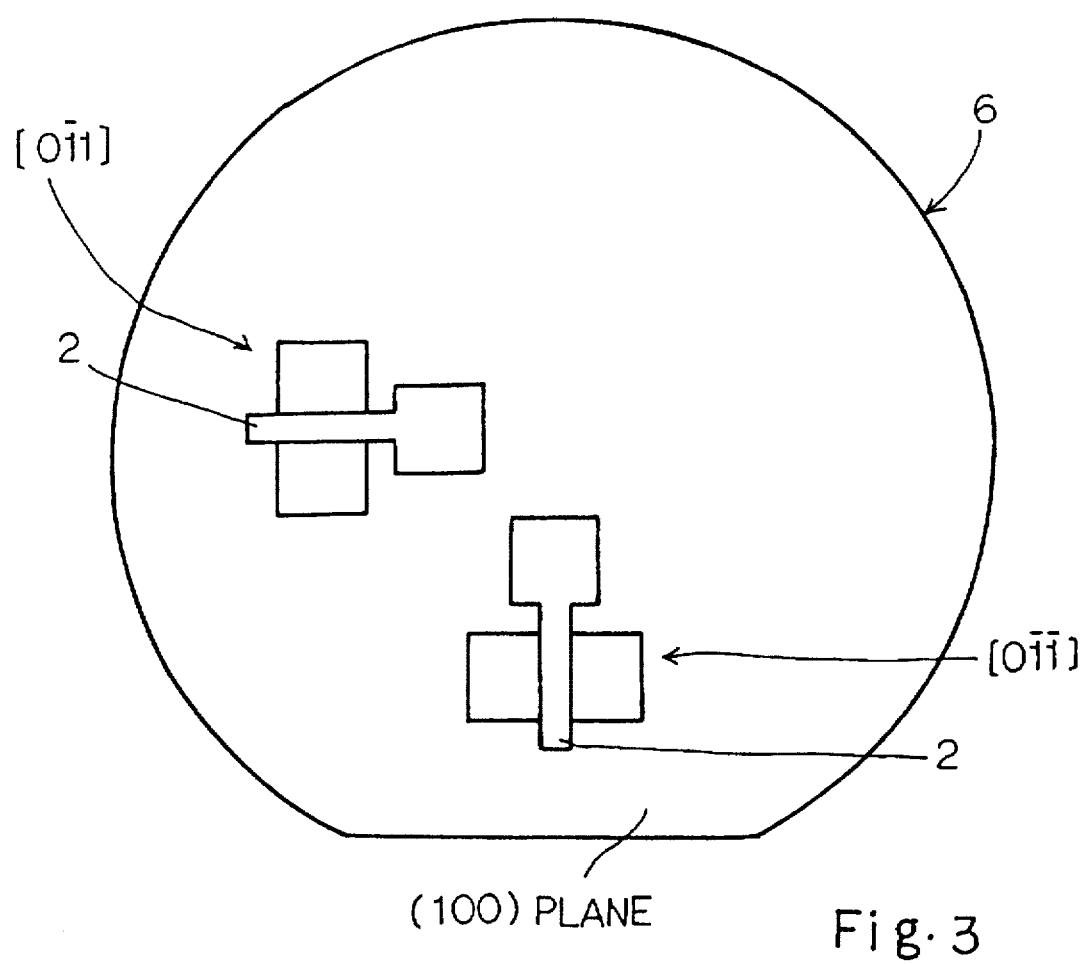
FIG. 3 is a plan view showing crystal planes of a gallium arsenide wafer where field effect transistors are fabricated.

Referring first to FIGS. 1 and 2 of the drawings, a field effect transistor embodying the present invention largely comprises a laminated compound semiconductor structure 1, a gate electrode 2 formed on the laminated compound semiconductor structure 1, ohmic contact electrodes 3a and 3b formed on the laminated compound semiconductor structure 1 on both sides of the gate electrode 2 and an insulating layer 4 covering the gate electrode 2 and the ohmic contact electrodes 3a and 3b.

As shown in FIG. 2, the laminated compound semiconductor structure 1 includes a semi-insulating substrate 1a of gallium arsenide, a buffer structure 1b formed on the semi-insulating substrate 1a, a channel layer 1c formed of intentionally undoped indium gallium arsenide on the buffer structure 1b, an electron supply layer 1d formed of n-type aluminum gallium arsenide on the channel layer 1c and a contact layer 1e formed of n-type gallium arsenide on the electron supply layer 1d. Intentionally undoped gallium arsenide layer 1f, intentionally undoped aluminum gallium arsenide layer 1g and intentionally undoped gallium arsenide layer 1h form the buffer structure 1b.

The semi-insulating substrate has the major surface overlain by the buffer structure 1b, and (100) crystal plane forms the major surface.

The contact layer 1e is partially removed so as to form a recess 1i, and a central area of the electron supply layer 1d is exposed to the recess 1i. The gate electrode 2 is held in contact with the exposed central area of the electron supply layer 1d, and the ohmic contact electrodes 3a and 3b are held in contact with the contact layer 1e on both sides of the recess 1i. The electron supply layer 1d is doped with n-type dopant impurity at $2 \times 10^{18}$ cm$^{-3}$ and the contact layer 1e is doped with n-type dopant impurity at $4 \times 10^{18}$ cm$^{-3}$.

The gate electrode 2 is shaped into a generally Y-letter configuration, and has a stem portion 2a and gate portions 2b and 2c obliquely extending from the upper end of the stem portion 2a. The stem portion 2b stands on the exposed central area of the electron supply layer 1d, and a conductive channel takes place or is removed beneath the stem portion 2a. Therefore, the stem portion 2a defines an effective channel length or a gate width, and the gate width is 0.6 micron in this instance.

The gate portions 2b and 2c projects over the contact layer 1e, and "Lw" is indicative of the projecting length from the step portion 2b/2c to the leading end of the gate portion 2b/2c.

The dielectric over layer 4 is formed of silicon oxynitride expressed as SiON, and is 1 micron in thickness. The wing portions 2b and 2c split the dielectric over layer 4 into an upper portion and a lower portion, and decrease the stress exerted on the electron supply layer 1d. For this reason, the gate electrode 2 effectively suppresses the piezoelectric effects.

When the gate electrode 2 is appropriately biased, electron flows along an electron confinement well generated in the channel layer 1c along the interface between the channel layer and the electron supply layer 1d, and the contact electrodes 3a and 3b are electrically connected to each other. However, if the bias is removed, the current path is removed, and the field effect transistor turns off.

In order to evaluate the projecting length dependency of the field effect transistor shown in FIG. 1, the present inventor fabricated the field effect transistors on the major surface of the semi-insulating gallium arsenide wafer 6, and the major surface was (100) crystal plane. The field effect transistors were identical in structure with the field effect transistor shown in FIG. 1, but were different in the orientation of the gate electrode 2. The field effect transistors were labeled with the gate orientation as shown. The field effect transistor [0 1* 1*]. FET meant the field effect transistor with the gate electrode oriented in [0 1* 1*] direction. The gate width was 0.6 micron in length. The dielectric over layer 4 was 1 micron thick, and generated the stress of $-3 \times 10^9$ dyn/cm$^2$.

Figure 4:
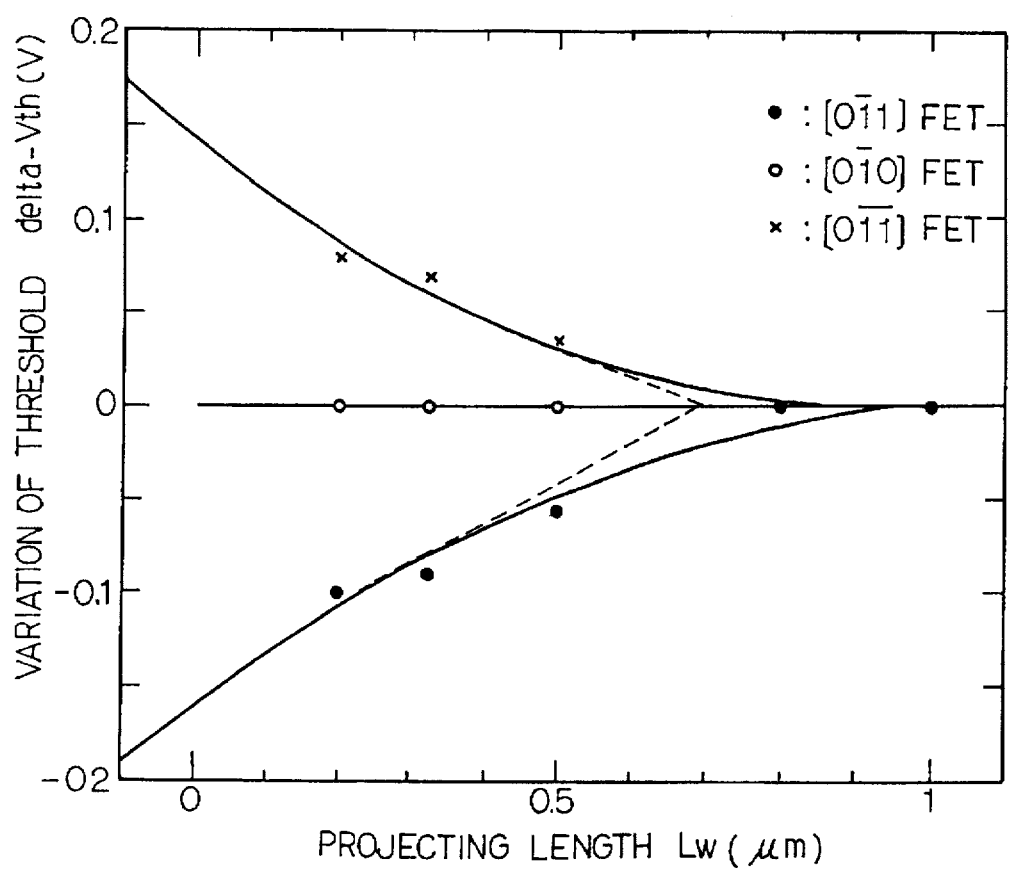
FIG. 4 is a graph showing variation of the threshold voltage of the field effect transistors in terms of the length of the gate portion.

The present inventor changed the projection length Lw, and measured the variation of threshold voltage delta-Vth. Delta-Vth was representative of the difference between the threshold voltage before the formation of the dielectric over layer 4 and the threshold voltage after the formation of the dielectric over layer 4. The threshold voltage was plotted in FIG. 4.

The recommendable projecting length Lw is variable depending upon the margin of the threshold. In general, the margin for the field effect transistor shown in FIG. 1 is ±50 mV or less, and the plots gives the recommendable projecting length as at least 0.5 micron. When the distance between both ends of the gate electrode 2 is at least 1.6 microns, the piezoelectric effects are restricted, and the field effect transistors are operable regardless of the gate orientation without malfunction.

In a similar manner, the present inventor evaluated field effect transistors having the gate width of 0.2 micron, and concluded that the projecting length Lw of 0.7 micron effectively restricted the piezoelectric effect regardless of the gate orientation.

Description is made on a process of fabricating the field effect transistor according to the present invention with reference to FIGS. 5A to 5F. However, the gate width is changed to 0.25 micron, and the projecting length Lw is regulated to 0.7 micron.

The process starts with preparation of the semi-insulating substrate 1a, and the laminated compound semiconductor structure 1b is formed on the major surface of the semi-insulating substrate 1a. In detail, using a molecular beam epitaxy, an intentionally undoped gallium arsenide layer, an intentionally undoped aluminum gallium arsenide layer, an intentionally undoped gallium arsenide layer, an intentionally undoped indium gallium arsenide layer, an n-type aluminum gallium arsenide layer and an n-type gallium arsenide layer are successively grown to 400 nanometers thick, 200 nanometers thick, 60 nanometers thick, 15 nanometers thick, 30 nanometers thick and 600 nanometers thick on the major surface of the semi-insulating substrate 1a, and serve as the lower buffer layer 1f, the middle buffer layer 1g, the upper buffer layer 1h, the channel layer 1c, the electron supply layer 1d and the contact layer 1e, respectively. The electron supply layer 1d and the contact layer 1e are doped at $2 \times 10^{18}$ cm$^{-3}$ and $4 \times 10^{18}$ cm$^{-3}$, respectively.

Figure 5A:
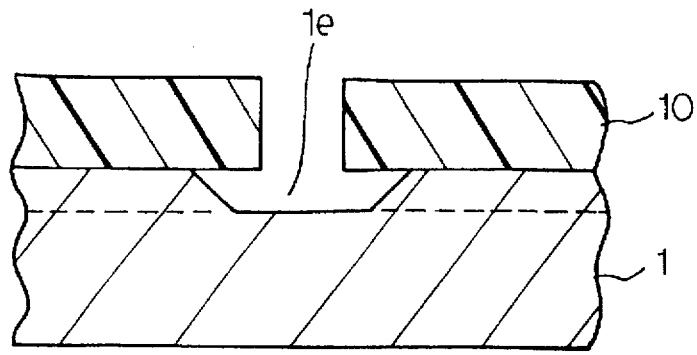
FIGS. 5A to 5F are cross sectional views showing a process sequence for fabricating the field effect transistor according to the present invention.

Photo-resist is spread over the n-type gallium arsenide layer, and the photo-resist layer is formed into a photo-resist etching mask 10 through lithographic techniques. The photo-resist etching mask 10 exposes an central area of the n-type gallium arsenide layer as shown in FIG. 5A.

The central area of the n-type gallium arsenide layer is etched away, and the recess 1i exposes the central area of the electron supply layer 1d. The n-type gallium arsenide layer thus selectively etched away serves as the contact layer 1e.

Figure 5B:
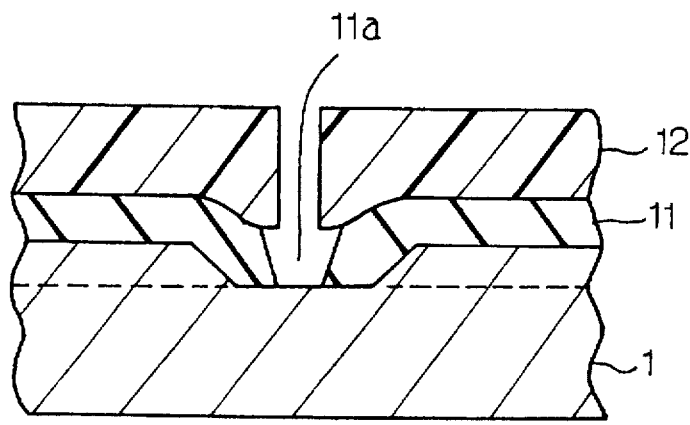

The photo-resist etching mask 10 is stripped off, and silicon oxide is deposited over the entire surface of the resultant structure by using a chemical vapor deposition, and a photo-resist etching mask 12 is formed on the silicon oxide layer 11. The photo-resist etching mask 12 exposes an area of the silicon oxide layer 1 over an central area of the exposed area of the electron supply layer 1d. The exposed area of the silicon oxide layer 11 is selectively etched away so as to form an opening 11a in the silicon oxide layer 11 as shown in FIG. 5B.

The photo-resist etching mask 12 is stripped off, and tungsten silicide WSi is deposited over the entire surface by using a sputtering, and a tungsten silicide layer 13 is held in contact through the opening 11a with the electron supply layer 1d. A photo-resist layer is patterned into a photo-resist mask 14, and the photo-resist mask 14 has an opening corresponding to the gate portions 2b and 2c as shown in FIG. 5C.

Figure 5C:
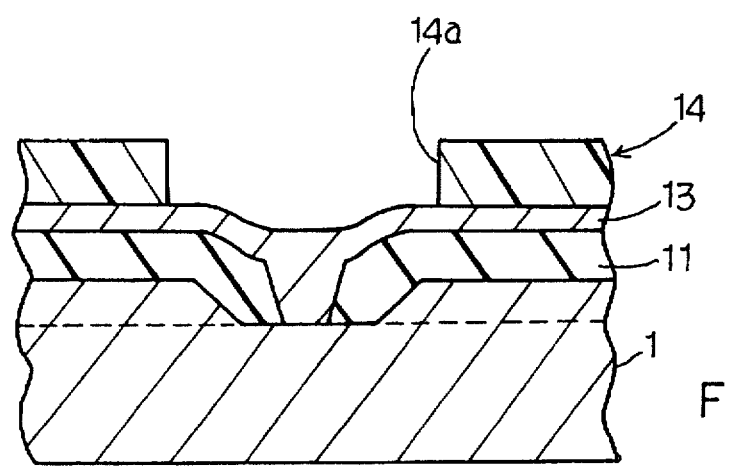
Figure 5D:
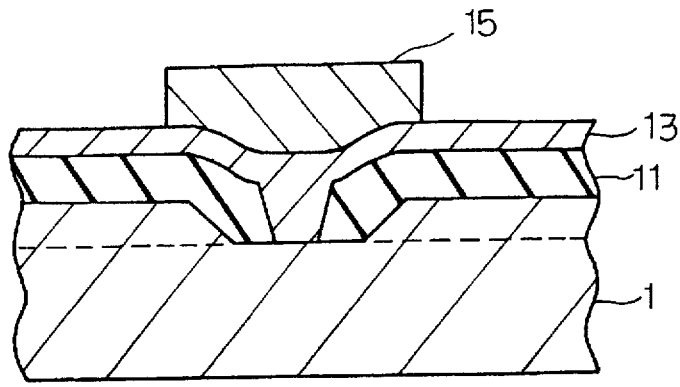

Titanium-platinum-gold alloy is deposited over the entire surface of the structure shown in FIG. 5C by using an evaporation, and the titanium-platinum-gold alloy layer is patterned into a titanium-platinum-gold alloy strip 15 by using a lift-off technique, and the resultant structure is illustrated in FIG. 5D.

Figure 5E:
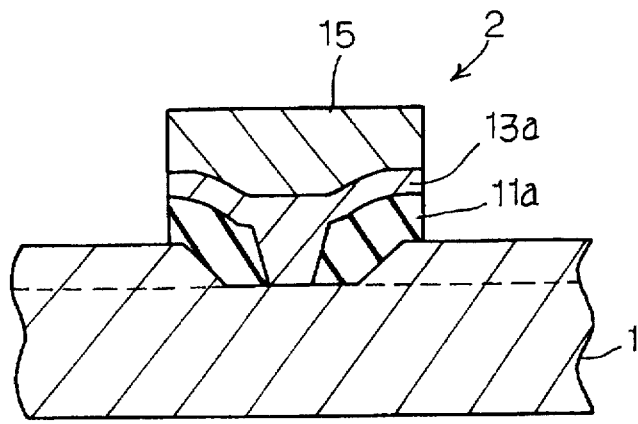

Using the titanium-platinum-gold alloy strip 15 as an etching mask, the tungsten silicide layer 13 and the silicon oxide layer 11 are selectively etched away through a dry etching process, and a tungsten silicide strip 13a and a silicon oxide layer 11a is left beneath the titanium-platinum-gold alloy strip 15 as shown in FIG. 5E. Thus, the opening 14a and, accordingly, the titanium-platinum-gold alloy strip 15 defines the distance between both ends of the gate electrode 2.

Figure 5F:
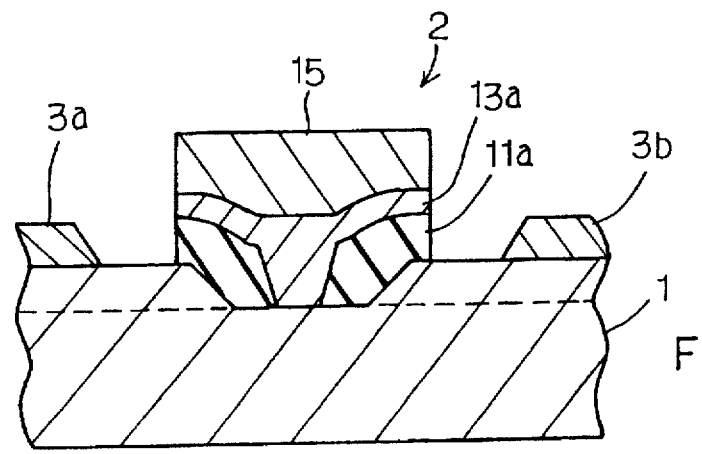

Finally, the contact electrodes 3a and 3b of Au/Ge/Ni/Au alloy are formed on the contact layer 1e by using an evaporation followed by a lift-off technique as shown in FIG. 5F.

Figure 6:
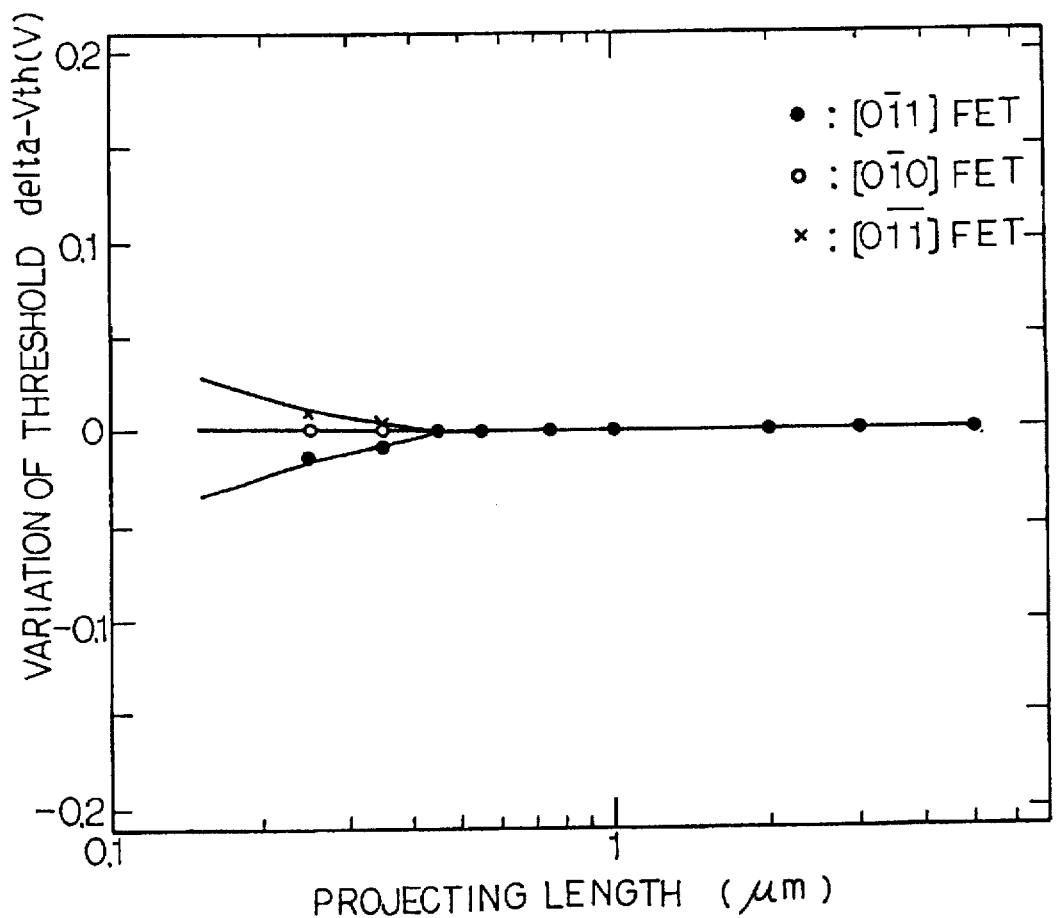
FIG. 6 is a graph showing the variation of the threshold in terms of the length of the gate measured by the present inventor.

The present inventor measured the threshold voltage of the field effect transistor shown in FIG. 5F, and deposited silicon oxynitride on the entire surface of the structure shown in FIG. 5F by using a plasma-assisted chemical vapor deposition. After the deposition, the present inventor measured the threshold voltage of the field effect transistor again. The variation of threshold voltage was plotted in FIG. 6, and confirmed that the variation delta-Vth fell within an admittable range regardless of the gate orientation.

Figure 7:
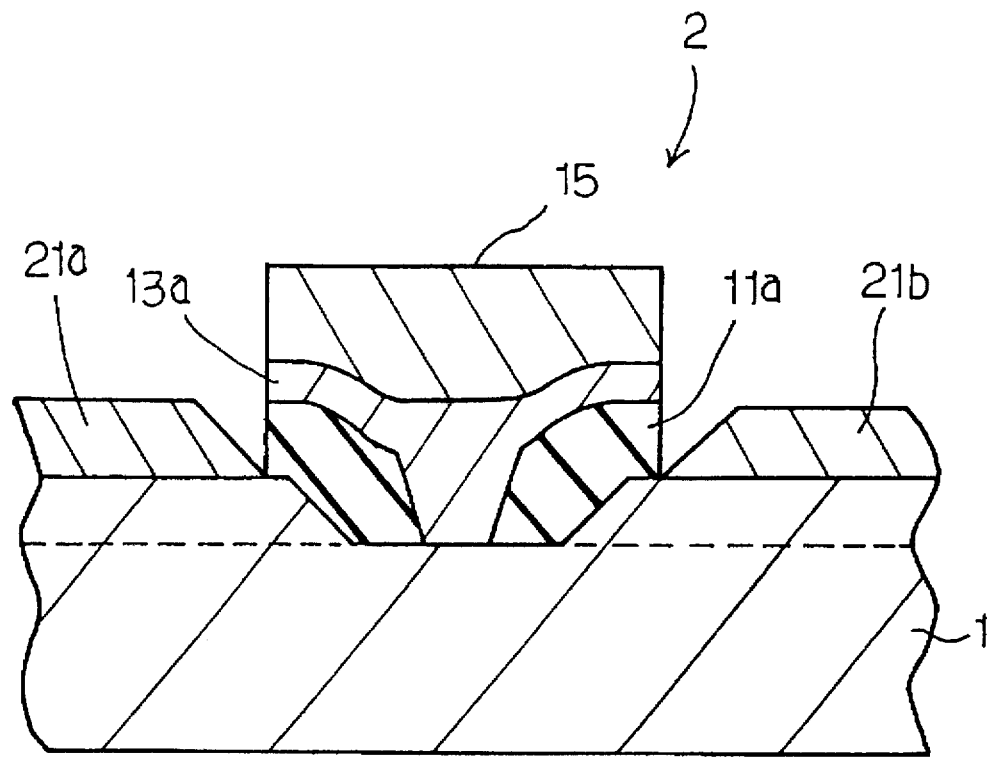
FIG. 7 is a cross sectional view showing the structure of another field effect transistor according to the present invention.

FIG. 7 illustrates a modification of the field effect transistor according to the present invention. The field effect transistor shown in FIG. 7 is similar to the field effect transistor shown in FIGS. 1 and 2 except for the positions of contact electrodes 21a and 21b, and, for this reason, the other layers are labeled with the same references designating corresponding layers in FIGS. 1 and 2. The contact electrodes 21a and 21b are positioned as close to the silicon oxide layer 11a as possible. The inner ends of the contact electrodes 21a and 21b may be held in contact with the silicon oxide layer 11a. The contact electrodes 21a and 21b effectively decrease the length of the current path, and improves the switching speed.

As will be appreciated from the foregoing description, the gate electrode 2 is prolonged without increase the gate width by virtue of the gate portion 2b/2c, and the gate portion 2b/2c splits the inter-level insulating layer 4 into an upper portion and a lower portion. As a result, the gate portion 2b/2c decreases the stress exerted on the active layer on both sides of the channel beneath the stem portion 2a, and the prolonged gate electrode restricts the piezoelectric effects regardless of the orientation thereof.

Although particular embodiments of the present invention have been shown and described, it will be obvious to those skilled in the art that various changes and modifications may be made without departing from the spirit and scope of the present invention.

For example, the gate electrode may have a T-letter configuration or a mushroom-like configuration, and the gate may be asymmetry, i.e., spreading from one side of the stem portion.

The present invention is effective against the piezoelectric effects in any semiconductor material having piezoelectric crystal structure such as, for example, SiGe, InP, InAlAs, GaSb, InSb, GaInP and GaN.

The doping may be carried out by using a delta-doping technique or a channel doping. The gate electrode according to the present invention may be formed of Aluminum or titanium-gold alloy. Another substance for an ohmic contact such as gold-magnesium alloy or nickel-germanium alloy is available for the contact electrodes 3a/3b. The contact electrodes 3a/3b may be formed through non-alloy contact process. The dielectric over layer 4 may be formed of another insulating substance such as silicon dioxide, silicon nitride or aluminum nitride.

A field effect transistor may be a MESFET (Metal-Semiconductor Field-Effect-Transistor) without an electron supply-layer. The gate electrode according to the present invention may be provided on a gate dielectric over layer covering a semiconductor layer.

The gate electrode 2 is not limited to the Y-letter configuration.

What is claimed is:

1. A field effect transistor comprising:
   an active layer formed of a semiconductor material having a piezoelectric crystal structure, and providing a conductive channel in a first area of said active layer for electrically connecting a second area of said active layer on one side of said first area to a third area of said active layer on the other side of said first area;

first and second electrodes held in contact with said second area and said third area, respectively;

a dielectric overlayer formed on said first, second and third areas; and a gate electrode formed in said dielectric overlayer, and having a stem portion provided over said first area for generating said conductive channel and a gate portion spread from said stem portion in such a manner as to extend in said dielectric overlayer over said active layer without forming a conductive channel, thereby decreasing a stress exerted on said second and third areas due to said dielectric overlayer.

2. The field effect transistor as set forth in claim 1, in which said active layer includes a channel forming sub-layer for forming said conductive channel, and an electron supply sub-layer formed on said channel forming sub-layer for generating an electric charge confinement well in said channel forming sub-layer along an interface therebetween in the presence of an appropriate bias in said gate electrode.

3. The field effect transistor as set forth in claim 2, in which said active layer further includes a buffer structure formed between a semi-insulating substrate and said channel forming sub-layer.

4. The field effect transistor as set forth in claim 1, in which said gate portion has a first gate sub-portion projecting from an upper end of said stem portion in one direction and a second gate sub-portion projecting from said upper end in the opposite direction.

5. The field effect transistor as set forth in claim 4, in which a leading end of said first gate sub-portion is spaced from a leading end of said second gate sub-portion, portion by at least 1.6 microns measured along said active layer.

6. The field effect transistor as set forth in claim 4, in which said dielectric overlayer is formed of silicon oxynitride.

7. The field effect transistor as set forth in claim 4, in which said first and second electrodes have respective inner ends located under leading ends of said first and second gate sub-portions, respectively.

* * * * *

UNITED STATES PATENT AND TRADEMARK OFFICE
CERTIFICATE OF CORRECTION

PATENT NO.   : 5,698,888
DATED        : December 16, 1997
INVENTOR(S)  : MUNEO FUKAISHI It is certified that error appears in the above-indentified patent and that said Letters Patent is hereby corrected as shown below:

Claim 5, Col. 8, line 12, after "sub-portion" delete --, portion--

Signed and Sealed this

Nineteenth Day of May, 1998

Attest:

BRUCE LEHMAN

Attesting Officer

Commissioner of Patents and Trademarks